(12) United States Patent
You et al.

(10) Patent No.: US 10,866,444 B2
(45) Date of Patent: Dec. 15, 2020

(54) DISPLAY DEVICE

(71) Applicant: LG Display Co., Ltd., Seoul (KR)

(72) Inventors: Koo-Han You, Gwangmyeong-si (KR); Da-Eun Min, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/518,742

(22) Filed: Jul. 22, 2019

(65) Prior Publication Data

US 2020/0150481 A1  May 14, 2020

(30) Foreign Application Priority Data

Nov. 13, 2018 (KR) .................. 10-2018-0139073

(51) Int. Cl.
*G02F 1/1333* (2006.01)
*G02F 1/1335* (2006.01)
*H01L 51/00* (2006.01)

(52) U.S. Cl.
CPC .. *G02F 1/133308* (2013.01); *G02F 1/133305* (2013.01); *G02F 1/133528* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

| | | | | |
|---|---|---|---|---|
| 8,792,252 B2 * | 7/2014 | Hwang | .................... | H05K 7/02 361/807 |
| 9,276,055 B1 * | 3/2016 | Son | .................... | H01L 51/5253 |
| 9,490,312 B2 * | 11/2016 | Lee | .................... | H01L 27/3276 |
| 9,773,853 B2 * | 9/2017 | Tao | .................... | H01L 51/0097 |
| 2015/0382446 A1 * | 12/2015 | Kwon | ................. | H01L 27/3276 174/251 |

* cited by examiner

*Primary Examiner* — Vip Patel
(74) *Attorney, Agent, or Firm* — Seed IP Law Group LLP

(57) ABSTRACT

A display device is disclosed. The display device includes a flexible substrate including a first area having a display area, a second area facing the first area, and a bending area connecting the first and second areas, a cover layer and a polarization layer disposed on the flexible substrate in the first area, a pad part disposed on the flexible substrate in the second area, a first support plate disposed on a lower surface portion of the flexible substrate corresponding to the first area, and a second support plate disposed on a lower surface portion of the flexible substrate corresponding to the second area, and a support member disposed between the first and second support plates. One end of the support member extends to contact a lower surface portion of the flexible substrate corresponding to the bending area and, as such, supports the radius of curvature of the bending area when the display device is in a bent position.

20 Claims, 9 Drawing Sheets

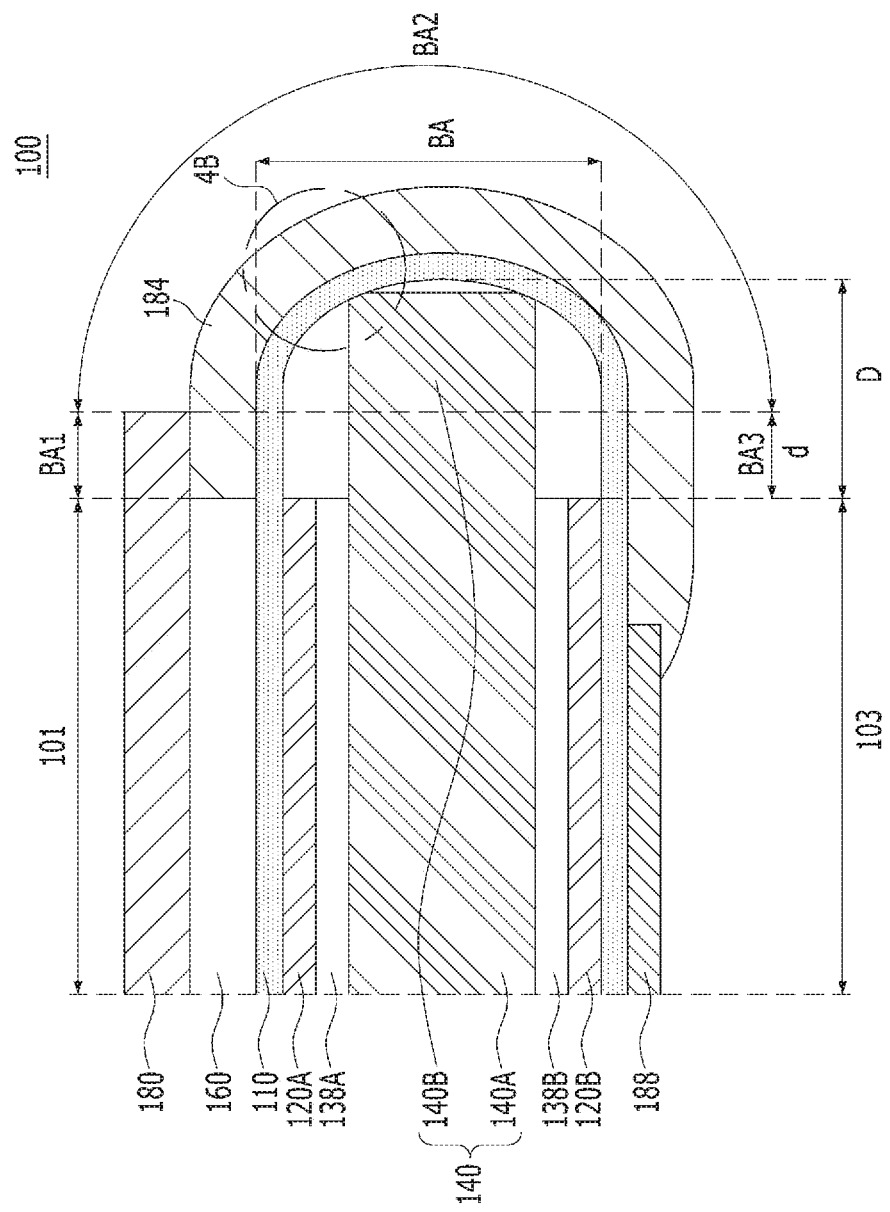

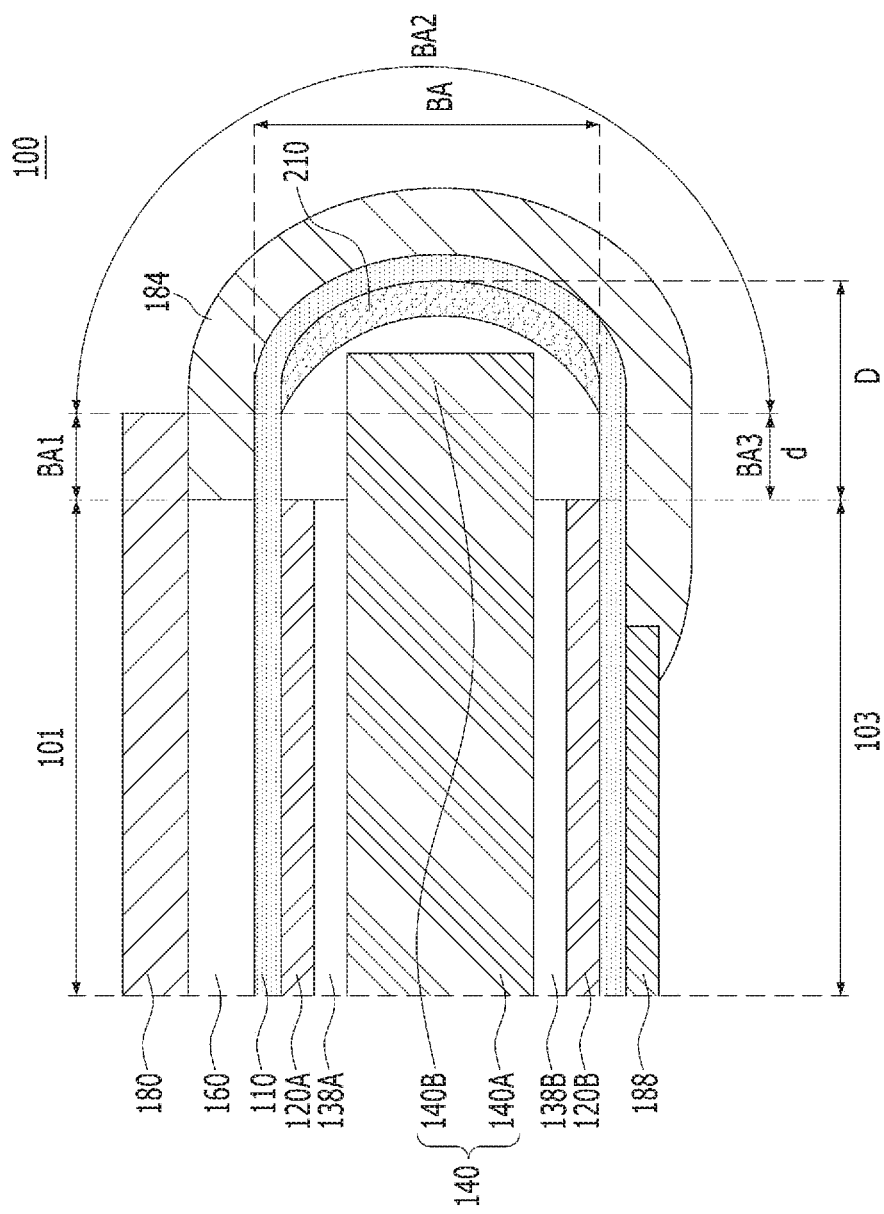

DISPLAY DEVICE

CROSS-REFERENCE TO RELATED APPLICATION

This application claims the benefit of Korean Patent Application No. 10-2018-0139073, filed on Nov. 13, 2018, which is hereby incorporated by reference as if fully set forth herein.

BACKGROUND

Technical Field

The present disclosure relates to a display device that is bendable.

Description of the Related Art

Image display devices, which render a variety of information on a screen, are core technologies of the information communication age, and are being developed toward further thinness, lightness, portability, and higher performance. As a result, an electroluminescent display device or the like, which displays an image through control of an amount of light emitted from a light emitting element is highlighted.

Such an electroluminescent display device does not have a separate light source unit and, as such, may be easily embodied as a flexible display device. In this case, a flexible material such as a thin film metal foil is used for a substrate of the electroluminescent display device.

Meanwhile, research is underway to curve or bend several portions of the display device by utilizing flexibility of the display device. This research is mainly conducted in association with implementation of new designs and user interface/user experience (UI/UX) in connection with an electroluminescent display device embodied as a flexible display device.

In addition, research efforts are underway to prevent short circuit of lines in a region where the flexible substrate of the flexible device is bent.

BRIEF SUMMARY

Accordingly, the inventors of the present disclosure recognized that reliability of a display device may be degraded due to damage and crack formation caused in a bending region by failure during folding, bending or winding operation of the display device. As such, they invented a display device capable of securing superior reliability and durability against damage and crack formation occurring in the bending region of the display device.

Embodiments of the present disclosure provide a display device having enhanced reliability against damage and crack formation occurring in a bending region of the display device.

In one embodiment, a display device includes a flexible substrate including a first area including a display area to display an image, a second area facing the first area while being spaced apart from the first area, and a bending area connecting the first area and the second area while being bent; a cover layer and a polarization layer, which are disposed on a portion of an upper surface of the flexible substrate corresponding to the first area; a pad part disposed on a portion of the upper surface of the flexible substrate corresponding to the second area; a first support plate disposed on a portion of a lower surface of the flexible substrate corresponding to the first area; a second support plate disposed on a portion of the lower surface of the flexible substrate corresponding to the second area; and a support member disposed between the first support plate and the second support plate. One end of the support member may extend to contact a portion of the lower surface of the flexible substrate corresponding to the bending area, to support the radius of curvature of the bending area when the display device is bent.

In an alternative embodiment, a display device includes a flexible substrate comprising a first area including a display area to display an image, a second area facing the first area while being spaced apart from the first area, and a bending area connecting the first area and the second area while being bent; a cover layer and a polarization layer, which are disposed on a portion of an upper surface of the flexible substrate corresponding to the first area; a pad part disposed on a portion of the upper surface of the flexible substrate corresponding to the second area; a first support plate disposed on a portion of a lower surface of the flexible substrate corresponding to the first area; a second support plate disposed on a portion of the lower surface of the flexible substrate corresponding to the second area; a support member disposed between the first support plate and the second support plate; and a foaming agent disposed on a portion of the lower surface portion of the flexible substrate corresponding to the bending area.

In another alternative embodiment, a display device comprises a flexible substrate including a first surface, a second surface, a first portion, a second portion, and a bendable portion extending from the first portion to the second portion; a polarization layer on the first surface and the first portion of the flexible substrate; a cover layer on the polarization layer; a protective layer on the first surface and the bending portion of the flexible substrate; a pad part on the first surface and the second portion of the flexible substrate; a first support plate on the second surface and the first portion of the flexible substrate; a second support plate on the second surface and the second portion of the flexible substrate; and a support member located between the first support plate and the second support plate.

BRIEF DESCRIPTION OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings:

FIG. 4A is a sectional view illustrating a bending structure of the flexible display device when in a bent position according to another alternative embodiment of the present disclosure;

FIGS. 5A and 5B are sectional views of a structure of the flexible display device when in a bent position according to another alternative embodiment of the present disclosure.

DETAILED DESCRIPTION

Figure 1:
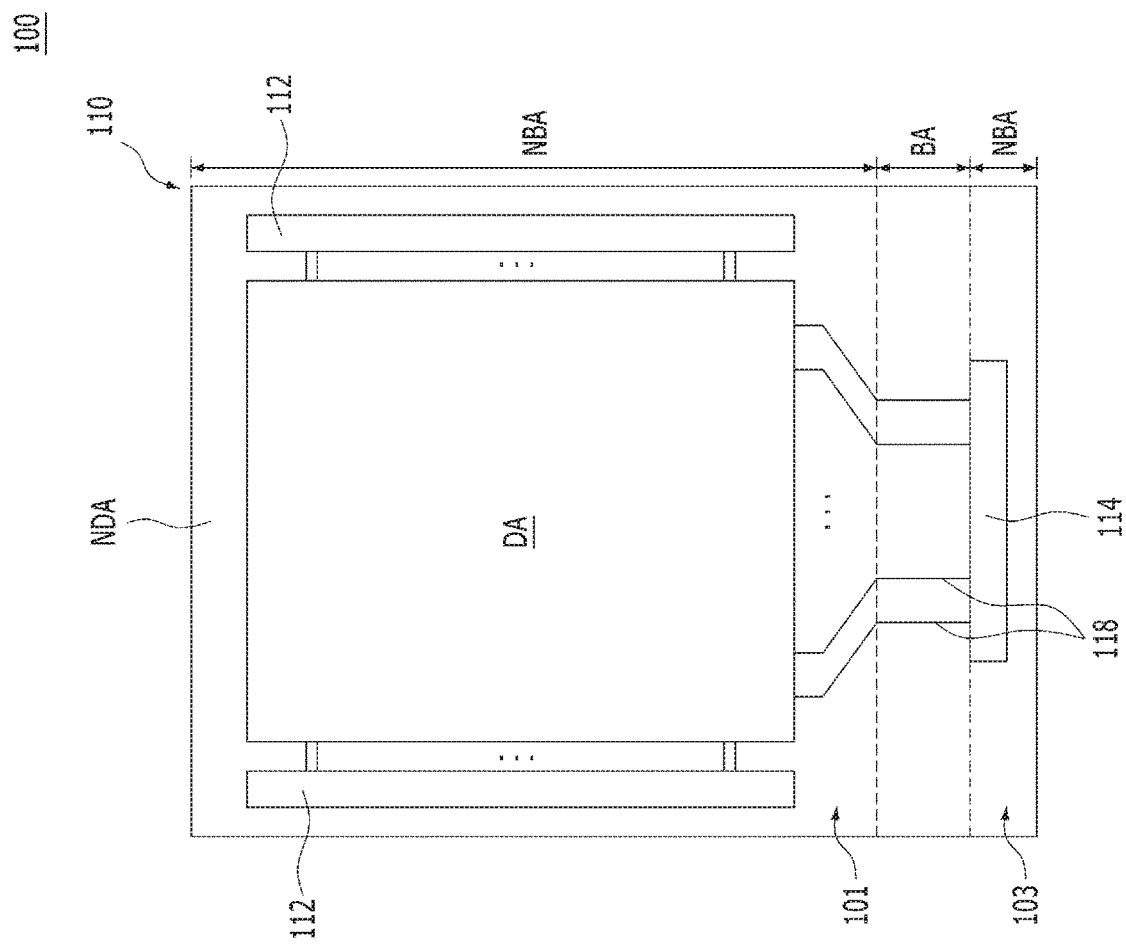
FIG. 1 is a view illustrating a flexible display device.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims.

The shape, size, ratio, angle, number and the like shown in the drawings to illustrate the embodiments of the present disclosure are only for illustration and are not limited to the contents shown in the drawings. Wherever possible, the same reference numbers will be used throughout the drawings to refer to the same or like parts. In the following description, detailed descriptions of technologies or configurations related to the present disclosure may be omitted so as not to unnecessarily obscure the subject matter of the present disclosure.

When terms such as "including", "having" and "comprising" are used throughout the specification, an additional component may be present, unless "only" is used. A component described in a singular form encompasses components in a plural form unless particularly stated otherwise.

It should be interpreted that the components included in the embodiment of the present disclosure include an error range, although there is no additional particular description thereof.

In describing a variety of embodiments of the present disclosure, when terms for positional relationship such as "on", "above", "under" and "next to" are used, at least one intervening element may be present between two elements unless "right" or "direct" is used.

In describing a variety of embodiments of the present disclosure, when a temporal relationship is described, for example, when terms for temporal relationship of events such as "after", "subsequently", "next", and "before" are used, there may also be the case in which the events are not continuous, unless "immediately" or "directly" is used.

In the meantime, although terms including an ordinal number, such as first or second, may be used to describe a variety of constituent elements, the constituent elements are not limited to the terms, and the terms are used only for the purpose of discriminating one constituent element from other constituent elements. For example, without departing from the scope of the present disclosure, a first constituent element may be named a second constituent element.

The term "at least one of" should be understood as including all combinations of one or more associated items. For example, "at least one of a first item, a second item and a third item" may not only mean each of the first item, the second item and the third item, but also mean all item combinations of two or more of the first item, the second item and the third item.

The respective features of various embodiments according to the present disclosure can be partially or entirely joined or combined and technically variably related or operated, and the embodiments can be implemented independently or in combination.

Hereinafter, an example of a display device according to an embodiment of the present disclosure will be described in detail with reference to the accompanying drawings.

FIG. 1 is a view illustrating an embodiment of a flexible display device 100.

The flexible display device means a display device provided with flexibility. The term "flexible display device" may be used to have similar meaning to the terms "bendable display device", "rollable display device", "unbreakable display device" and "foldable display device".

The flexible display device 100 includes at least one display area DA. In the display area DA, an array of pixels is formed. One or more non-display areas NDA may be located around the display area DA. For example, the non-display areas NDA may be adjacent to one or more sides of the display area DA, respectively.

As illustrated in FIG. 1, the non-display areas NDA may surround the display area DA, which has a quadrangular shape. The non-display areas NDA may form a perimeter or boundary surrounding the display area DA. Of course, the shape of the display area DA and the shape/arrangement of the non-display areas NDA adjacent to the display area DA are not limited to this embodiment of the flexible display device 100 illustrated in FIG. 1.

The display area DA and the non-display areas NDA may have shapes suitable for the design of an electronic appliance equipped with the flexible display device 100. Electronic appliances may be cell phones, smart phones, laptops, televisions, tablets, calculators, etc., but are not limited thereto and may be any other electronic appliance as desired. A shape of the display area DA may be a pentagonal shape, a hexagonal shape, a circular shape, an oval shape, etc., but is not limited thereto and may be any other shape as desired.

The pixels in the display area DA may be associated with pixel circuits, respectively. Each pixel circuit may include one or more switching transistors and one or more driving transistors. Each pixel circuit may be electrically connected to a gate line and a data line in order to communicate with one or more driving circuits such as a gate driver and a data driver.

Each driving circuit 112 may be embodied as a thin film transistor (TFT) disposed in one non-display area NDA. The driving circuits 112 may be referred to as a "gate-in-panel (GIP)". In addition, certain other components such as a data driver integrated circuit (IC) may be mounted on a printed circuit board (PCB). The driving circuits 112 may be coupled to connecting interfaces, for example, pads, bumps, pins, etc., but not limited thereto, disposed in the non-display areas NDA, using a circuit film such as a flexible PCB (FPCB), a chip on film (COF), a tape-carrier-package (TCP), etc., but is not limited thereto.

The flexible display device 100 may include various additional components for generating various signals or driving the pixels in the display area DA. The additional components that drive the pixels may include an inverter circuit, a multiplexer, an electrostatic discharge (ESD) circuit, etc., but are not limited thereto and may be any other component for driving the pixels. The flexible display device 100 may also include additional components associated with functions irrespective of pixel driving. For example, the additional components associated with functions irrespective of pixel driving of the flexible display device 100 may include additional components for providing a touch sensing function, a user authentication function (for example, fingerprint recognition), a multi-level pressure sensing function, a tactile feedback function, etc., but not limited thereto and may be any other additional component associated with functions irrespective of pixel driving. The above-described additional components may be disposed in the non-display areas NDA and/or external circuits connected to the connecting interfaces.

The flexible display device 100 includes a flexible substrate 110 made of a material having flexibility such that the flexible substrate 110 is bendable. For example, the flexible substrate 110 may be embodied as a thin film of plastic made of a polymer such as polyimide (PI), polyethylene naphthalate (PEN), or polyethylene terephthalate (PET), but is not limited thereto and may be any other thin film of material as desired. Accordingly, the flexible substrate 110 may be bendable. For example, the flexible substrate 110 may be bendable in a horizontal direction, a vertical direction, a diagonal direction, etc. In this regard, the flexible substrate 110 may be bendable in a combination of vertical, horizontal and diagonal directions, based on a design required in the flexible display device 100, but is not limited to such bending directions and may be bendable along any direction or combination of directions as desired.

The flexible substrate 110 may include a first area 101, a bending area BA extending to one side of the first area 101, and a second area 103 extending from one side of the bending area BA. The bending area BA may be disposed between the side of the first area 101 and a side of the second area 103. In addition, the bending area BA may connect the side of the first area 101 and the side of the second area 103 while the bending area BA is bent. The first area 101 may be a non-bending area NBA including the display area DA. The second area 103 may be a non-bending area NBA spaced apart from the first area 101. The bending area BA may be positioned between the first area 101 and the second area 103. In this case, the second area 103 includes a pad part 114.

The flexible substrate 110 may be bendable at a portion thereof. For example, as illustrated in FIG. 1, a lower end portion of the display area DA may be bendable. For example, the flexible substrate 110 may be bent in the bending area BA and, as such, the second area 103 may be folded toward a back side of the first area 101.

In FIG. 1, one non-display area NDA of the flexible substrate 110 is shown as being bent. However, the present disclosure is not limited to such a condition. For example, in alternative embodiments, the display area DA of the flexible substrate 110 may be bent at a portion thereof as well. In these alternative embodiments, an image is displayed on the bent portion of the display area DA and, as such, the flexible display device 100 may include a substantially flat display area DA and a bent display area DA.

In one non-display area NDA of the second area 103 in the flexible substrate 110, the pad part 114 or an interface similar thereto may be disposed. For example, as illustrated in FIG. 1, the pad part 114 may be disposed in the non-display area NDA, which contacts the bending area BA at the lower end portion of the flexible substrate 110. The pad part 114 may be a contact terminal connected to a circuit film such as an FPCB, to connect the circuit film to conductive lines 118.

Thin film transistors respectively connected to light emitting elements may be disposed in the display area DA. Each thin film transistor operates in association with a corresponding one of the driving circuits or drivers 112 disposed in one non-display area NDA, to control an amount of driving current supplied to the corresponding light emitting element, which may be, for example, an organic light emitting element.

The drivers 112 may be disposed in selected ones of the non-display areas NDA of the flexible substrate 110, to supply driving signals to the corresponding thin film transistors, respectively. For example, each driver 112 may be a gate driver for supplying a gate signal to the corresponding thin film transistors. The driver 112 may include various gate driving circuits, and the gate driving circuits may be directly formed on the flexible substrate 110. In this case, the driver 112 may be referred to as a "gate-in-panel" (GIP).

The data driver, which supplies a data signal to the thin film transistors, is mounted on a PCB, and may be connected to the flexible substrate 110 via a circuit film such as an FPCB, or may be directly disposed on the pad part 114 of the flexible substrate 110 in a suitable manner such as a COF manner.

Figure 2:
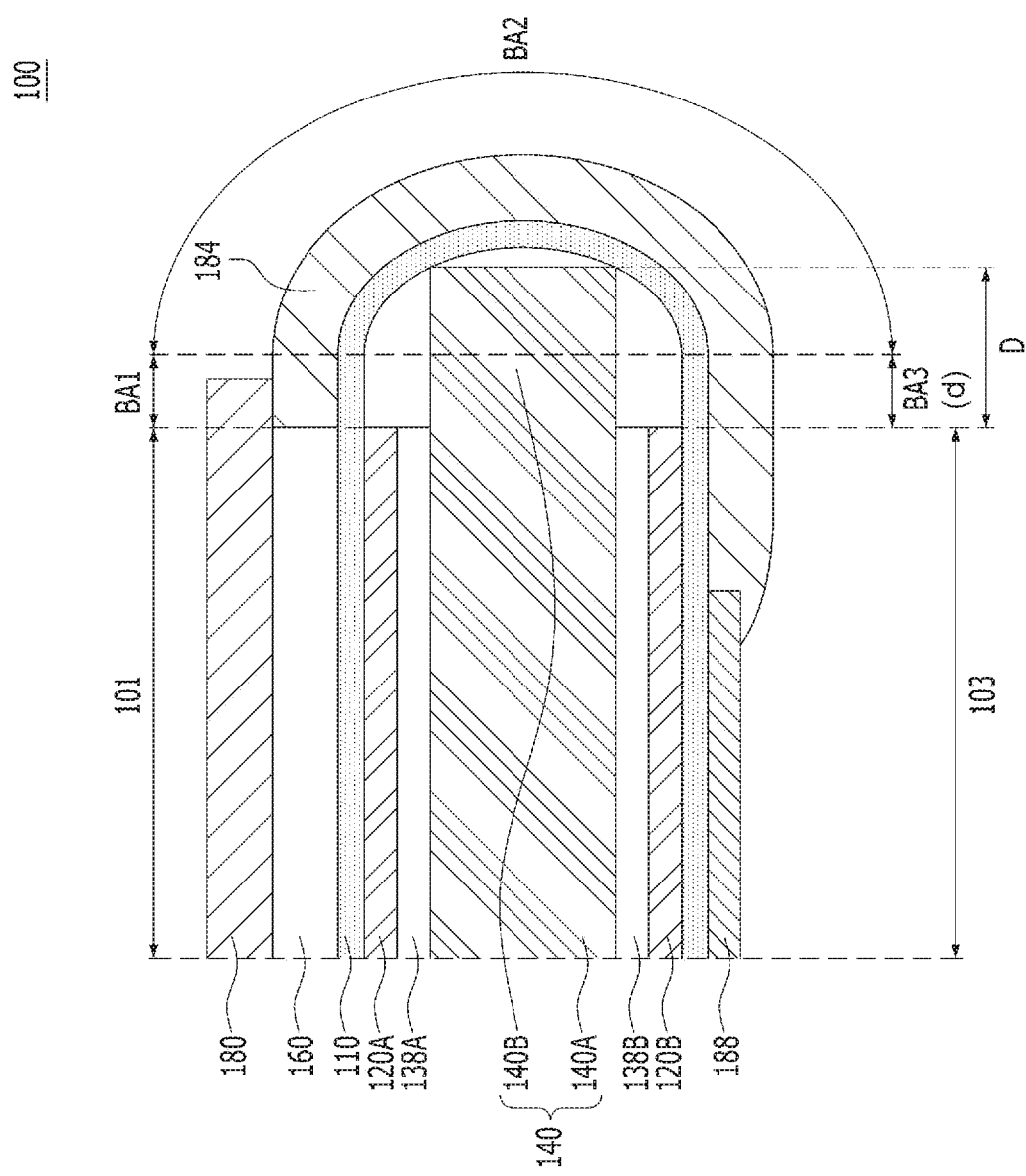
FIG. 2 is a sectional view illustrating a bending structure of the flexible display device when in a bent position according to an embodiment of the disclosure.

FIG. 2 is a sectional view illustrating an embodiment of a bending structure of the flexible display device 100 according to the embodiment of the disclosure.

Referring to FIG. 2, the flexible display device 100 according to the embodiment of the present disclosure may include the flexible substrate 110. As illustrated in FIG. 2, the flexible substrate 110 may include the bending area BA and the non-bending areas NBA. In this case, the bending area BA may be defined as an area not supported by support plates 120A and 120B, and the non-bending areas NBA may be defined as areas supported by the support plates 120A and 120B. The non-bending areas NBA may include the first area 101 including the display area DA, and the second area 103 including the pad part 114. The first area 101 of the flexible substrate 110 is an area on which an image is displayed. A polarization layer 160 and a cover layer 180 may be on the flexible substrate 110 in the first area 101. The second area 103 is an area facing the first area 101 while being spaced apart from the first area 101. The pad part 114 may be in the second area 103. The bending area BA, which is an area where the flexible substrate 110 is bent, may be between the first area 101 where the polarization layer 160 and the cover layer 180 are disposed and the second area 103 where the pad part 114 is disposed. The bending area BA may extend to one side of the first area 101 of the non-bending area NBA, and the second area 103 of the non-bending area NBA may extend to one side of the bending area BA. For example, the bending area BA may connect one end of the first area 101 and one end of the second area 103 while the bending area BA is in a bent shape.

The polarization layer 160 and the cover layer 180 may be on an upper surface of the flexible substrate 110 corresponding to the first area 101. The pad part 114 may be on the upper surface of the flexible substrate 110 corresponding to the second area 103. In the flexible substrate 110, the bending area BA may be positioned between the first area 101 and the second area 103. However, in other alternative embodiments, the pad part 114 may be on a lower surface of the flexible substrate 110. The upper surface and the lower surface may be first and second surfaces.

The flexible display device 100 may further include a plurality of support plates 120A, 120B, for example, the support plates 120A, 120B being on the lower surface of the flexible substrate 110 in areas corresponding to the first area 101 and the second area 103, respectively, and a support member 140 for supporting the plurality of support plates 120A, 120B and guiding the bending area BA to a bent shape. The plurality of support plates may include a first support plate 120A, which is located in an area corresponding to the first area 101, and a second support plate 120B, which is located in an area corresponding to the second area 103. The first support plate 120A may be on the lower surface of the flexible substrate 110 corresponding to the first area 101. The second support plate 120B may be on the lower surface of the flexible substrate 110 corresponding to the second area 103.

A display device may be formed on the flexible substrate 110 in the display area DA of the first area 101. The display device may include at least one of a liquid crystal display device and an electroluminescent display device including an organic light emitting device or an inorganic light emitting device, but is not limited thereto and may be any other light emitting device as desired. In the flexible display device 100 according to the embodiment of the present disclosure, the polarization layer 160 is formed on the flexible substrate 110 in the first area 101, and the cover layer 180 is formed on the polarization layer 160.

The bending area BA may be an area between or not supported by the first support plate 120A and the second support plate 120B. The bending area BA may include a first bending area BA1 adjacent to or neighboring the first area 101, a third bending area BA3 adjacent to or neighboring the second area 103, and a second bending area BA2 located between the first bending area BA1 and the third bending area BA3.

The first bending area BA1 may be adjacent to or neighboring the first area 101, and the flexible substrate 110 may have a substantially flat section not supported by the first support plate 120A at a portion of the flexible substrate 110 located in the first bending area BA1. The third bending area BA3 may be adjacent to or neighboring the second area 103, and the flexible substrate 110 may also have a substantially flat section not supported by the second support plate 120B at a portion of the flexible substrate 110 located in the third bending area BA3. The second bending area BA2 may be between the first bending area BA1 and the third bending area BA3, and the flexible substrate 110 may also have a curved section that is substantially bent at a portion of the flexible substrate 110 thereof disposed in the second bending area BA2.

The bending area BA includes the first bending area BA1 and the third bending area BA3, which are substantially flat. The conductive lines 118 adjacent to where the bending starts in the bending area BA may be shifted by a predetermined distance. The conductive lines 118 may be shifted by the predetermined distance within the first bending area BA1. This shift in the conductive lines 118 by the predetermined distance within the first bending area BA1 reduces the likelihood of mechanical failure or loss in function of the conductive lines 118 when the flexible substrate 110 is bent at the second bending area BA2 because the conductive lines 118 have greater flexibility due to the angle in the conductive lines 118 formed by the shift of the predetermined distance. In addition, there may be an effect that stress caused by bending in the bending area BA is dispersed in the first bending area BA1, the second bending area BA2, and the third bending area BA3.

The first bending area BA1 and the third bending area BA3 may be formed to have a length of 50 to 200 µm.

When the first bending area BA1 and the third bending area BA3 are formed to have a length less than 50 µm, in the flexible display device 100 according to the embodiment of the present disclosure, stress caused by bending may be generated in the first bending area BA1 and the third bending area BA3 and, as such, may be concentrated on certain areas including the first bending area BA1 and the third bending area BA3. When stress is concentrated on certain areas including the first bending area BA1 and the third bending area BA3, stress may be concentrated on the conductive lines 118 formed on one surface of the flexible substrate 110 in the first bending area BA1 and the third bending area BA3, as described above. Furthermore, when the conductive lines 118 are subjected to repeated bending strain, the lines may lose functions thereof, and electrical short circuit or mechanical breakage may occur. The conductive line 118 breakage may be concentratedly generated in the first bending area BA1 and the third bending area BA3, or may be generated in a neutral plane of the bending area BA.

Furthermore, when stress caused by bending is concentrated on the first bending area BA1 and the third bending area BA3, the portion of the first support plate 120A disposed adjacent to the first bending area BA1, the portion of the flexible substrate 110 in the first area 101, the portion of the second support plate 120B disposed adjacent to the second bending area BA2, and the portion of the flexible substrate 110 in the second area 103 may be peeled off.

On the other hand, when the first bending area BA1 and the third bending area BA3 are formed to have a length exceeding 200 µm, the non-display area NDA increases horizontally by a length corresponding to increased lengths of the first bending area BA1 and the third bending area BA3. As a result, visible distortion may increase.

In addition, an electrode for sensing touch input from the user may be formed in the cover layer 180 at one surface thereof and/or in the polarization layer 160. If necessary, a separate layer, at which the touch sensing electrode and/or other elements associated with touch input sensing are provided (hereinafter referred to as a "touch sensor layer"), may be provided as a portion of the flexible display device 100. The touch sensor layer may include at least one modified dielectric material. At least one electrode may interface with the touch sensor layer, or may be disposed in the vicinity of the touch sensor layer, and, as such, electrical variation in the electrode may be measured in the form of a readable signal. The measured results may be analyzed and, as such, the pressure input to the flexible display device 100 may be evaluated as one of plural different levels.

The plurality of support plates, for example, the support plates 120A, 120B, may be adhered to one surface of the flexible substrate 110 in the display area DA or the non-display area NDA, to support the lower surface of the flexible substrate 110. The plurality of support plates, for example, the support plates 120A, 120B, may function to avoid attachment of foreign matter to the lower surface of the flexible substrate 110, to avoid moisture penetration into the flexible substrate 110, and to buffer against external impacts applied to the flexible substrate 110 or the display device 100. In accordance with the embodiment of the present disclosure, the plurality of support plates, for example, the support plates 120A, 120B, may be made of a material having higher hardness than the flexible substrate 110, without being limited thereto. In other alternative embodiments, the plurality of support plates 120A, 120B may have a hardness that is equal to the flexible substrate 110 or less than the flexible substrate 110.

The plurality of support plates may include the first support plate 120A corresponding to the first area 101, and the second support plate 120B corresponding to the second area 103. The plurality of support plates 120A, 120B may not be formed on the portion of the flexible substrate 110 in the bending area BA and, as such, the flexible substrate 110 may be freely bendable and deformable at the bending area BA.

The flexible display device 100 according to the embodiment of the present disclosure may include the support member 140, which supports the flexible substrate 110, and maintains a radius of curvature of the bending area BA.

The support member 140 may have a first surface of the support member 140 facing the first support plate 120A positioned to correspond to the first area 101, and a second surface of the support member 140 facing the second support plate 120B disposed to correspond to the second area 103 when the flexible substrate 110 is in a bent position. The support member 140 may be disposed between the first support plate 120A and the second support plate 120B. The support member 140 may support the first support plate 120A and the second support plate 120B under the condition that the support member 140 is disposed between the first support plate 120A and the second support plate 120B when the flexible substrate 110 is in a bent position. As the support member 140 supports the first support plate 120A and the second support plate 120B, the support member 140 may support the first area 101 and the second area 103 of the flexible substrate 110 when in a bent position. In addition, one end of the support member 140 may contact a lower surface portion of the flexible substrate 110 corresponding to the bending area BA in order to support the bending area BA of the flexible substrate 110 or to support bending of the flexible substrate 110. For example, a first end of the support member 140 may extend to contact the lower surface portion of the flexible substrate 110 corresponding to the bending area BA and, as such, may support and maintain the radius of curvature of a portion of the flexible substrate 110 corresponding to the bending area BA when in a bent position.

The support member 140 may be made of a plastic material such as polycarbonate (PC), polyimide (PI), polyethylene naphthalate (PEN), or polyethylene terephthalate (PET), but is not limited thereto. The strength of the support member 140 made of a plastic material may be controlled by an additive for increasing the thickness and/or strength of the support member 140.

Alternatively, the support member 140 may be made of a material such as a double-sided foam tape having a certain impact buffering performance and adhesiveness. In other alternative embodiments, the support member 140 may be made of a hard material such as glass, ceramic, metal, a composite, or a combination thereof.

In accordance with the embodiment of the present disclosure, the support member 140 may include a first support member portion 140A for supporting lower surface portions of the flexible substrate 110 in the first area 101 and the second area 103, and a second support member portion 140B for supporting a lower surface portion of the flexible substrate 110 in the bending area BA. The length, D, of the second support member portion 140B may be defined by a maximum length of the second support member portion 140B of the support member 140, which does not support the first area 101 and the second area 103. Otherwise, the length D of the second support member portion 140B may be a horizontal distance from one end of the support member 140 to an end of the first support plate 120A facing towards the bending area BA when the flexible substrate 110 is in a bent position. For example, the second support member portion 140B may be a portion of the support member 140 disposed in an area extending from one end of the support member 140 contacting the portion of the flexible substrate 110 corresponding to the bending area BA to the end of the first support plate 120A facing towards the bending area BA when the flexible substrate 110 is in the bent position. In this case, the first support member 140A may be a portion of the support member 140 disposed in an area corresponding to the first support plate 120A supporting the portion of the flexible substrate 110 corresponding to the first area 101. Alternatively, the second support member portion 140B may be a portion of the support member 140 disposed in an area extending from one end of the support member 140 contacting the portion of the flexible substrate 110 corresponding to the bending area BA to the end of the second support plate 120B facing toward the bending area BA when the flexible substrate 110 is in the bent position. In this case, the first support member portion 140A may be a portion of the support member 140 located in an area corresponding to the second support plate 120B supporting the portion of the flexible substrate 110 corresponding to the first area 101. As illustrated in FIG. 2, the length D of the second support member 140B may be a horizontal distance of an area extending from one end of the first support plate 120A or one end of the second support member portion 140B to the bending area BA. For example, the length D of the second support member portion 140B may be a horizontal distance from the end of the first support plate 120A facing towards the bending area BA to one end of the support member 140 contacting the portion of the flexible substrate 110 corresponding to the bending area BA. Alternatively, the length D of the second support member portion 140B may be a horizontal distance from the end of the second support plate 120B disposed toward the bending area BA to one end of the support member 140 contacting the portion of the flexible substrate 110 corresponding to the bending area BA.

In accordance with the embodiment of the present disclosure, the second support member 140B may be formed to have a length of 200 to 500 μm.

When the length D of the second support member portion 140B is less than 200 μm, the lengths, d, of the first and third bending areas BA1 and BA3 may be reduced corresponding to the length D of the second support member portion 140B. In the flexible display device 100 according to the embodiment of the present disclosure in this case, stress caused by bending may be generated in the first bending area BA1 and the third bending area BA3 and, as such, may be concentrated on a certain area including the first bending area BA1 and the third bending area BA3. When bending stress is concentrated on a certain area including the first bending area BA1 and the third bending area BA3, stress may be concentrated on the conductive lines 118 formed on portions of one surface of the flexible substrate 110 in the first bending area BA1 and the third bending area BA3. When the conductive lines 118 are subjected to repeated bending strain, the conductive lines 118 may lose functions thereof, and electrical short circuit or mechanical breakage may occur. Line breakage may be concentratedly generated in the first bending area BA1 and the third bending area BA3, or may be generated in the neutral plane of the bending area BA.

Furthermore, when stress caused by bending is concentrated on the first bending area BA1 and the third bending area BA3, the portion of the first support plate 120A disposed adjacent to the first bending area BA1, the portion of the flexible substrate 110 in the first area 101, the portion of the second support plate 120B disposed adjacent to the second bending area BA2, and the portion of the flexible substrate 110 in the second area 103 may be peeled off.

On the other hand, when the length D of the second support member portion 140B exceeds 500 μm, the lengths d of the first and third bending areas BA1 and BA3 may be increased corresponding to the length D of the second support member portion 140B. In this case, the non-display area NDA increases horizontally by a length corresponding to increased lengths of the first bending area BA1 and the third bending area BA3. As a result, visible distortion may increase.

In order to stably hold the support member 140 in the flexible display device 100, adhesive layers 138A, 138B may be provided at surfaces of the support member 140.

The adhesive layers 138A, 138B may include a pressure-sensitive adhesive, a foam type adhesive, a liquid adhesive, a light-curable adhesive or may be any other suitable adhesive material or combination of adhesive materials. In some embodiments, the adhesive layers 138A, 138B may be made of a compressible material. When the adhesive layers 138A, 138B are made of a compressible material, the adhesive layers 138A, 138B may function as buffering members in areas to which the adhesive layers 138A, 138B are adhered.

For example, the materials of the adhesive layers 138A, 138B may be compressible. The adhesive layers 138A, 138B may have a multilayer structure. In this case, the multilayer structure may further include a buffering layer interposed between upper and lower adhesive layers. For example, the buffering layer may include a polyolefin foam, but is not limited thereto. The adhesive layers 138A, 138B may be disposed at one or more of the upper and lower surfaces portions 140A, 140B of the support member 140.

In accordance with the embodiment of the present disclosure, the flexible display device 100 may further include a protective coating layer 184 for protecting the portion of the flexible substrate 110 in the bending area BA. For example, the protective coating layer 184 may be disposed at an upper surface portion of the flexible substrate 110 corresponding to the bending area BA.

A protective layer 184 may be needed to protect the conductive lines 118 in the bending area BA of the flexible display device 100. Meanwhile, inorganic insulating layers may be etched from the bending area BA of the flexible display device 100 in order to avoid formation of cracks in the flexible display device 100 and, as such, the conductive lines 118 in the bending area BA may become weak against moisture penetration and foreign matter. To this end, the protective coating layer 184, which may also be referred to as a "microcoating layer," may be disposed on the conductive wires and/or lines 118 in the bending area BA.

The protective coating layer 184 may be coated over the bending area BA to a particular thickness in order to adjust a neutral plane of the flexible display device 100 in the bending area BA. When a portion of the flexible substrate 110 is bent, an inner surface of the bent portion in the flexible substrate 110 is subjected to a compressive force, and an outer surface of the bent portion is subjected to a tensile force. In connection with this, a neutral plane, which is subjected to neither tensile force applied to the outer surface of the flexible substrate 110 nor compressive force applied to the inner surface of the flexible substrate 110, may be formed at the surface of the flexible substrate 110, at which the conductive lines 118 are provided, by additionally forming the protective coating layer 184 on the outer surface of the flexible substrate 110.

The protective coating layer 184 has sufficient flexibility and, as such, may be usable in the bending area BA of the flexible display device 100. In addition, the protective coating layer 184 may be made of a material, which may be cured with low energy within a limited time, in order to avoid damage to elements disposed beneath the protective coating layer 184 during curing of the protective coating layer 184. The protective coating layer 184 may be made of light-curable acryl resin, which may be curable by light, for example, ultraviolet (UV) light, visible light or any other light as needed to cure the protective coating 184. In order to suppress penetration of moisture through the protective coating layer 184, one or more getter materials may be added to the protective coating layer 184. The protective coating layer 184 may cover a side surface of the cover layer 180.

The flexible substrate 110 may be electrically connected to a PCB 188 on a portion of the flexible substrate 110 in the second area 103 including the non-display area NDA.

In order to test bending reliability of the flexible display device 100 according to the embodiment of the present disclosure, a sample of the flexible display device 100 including the first support member portion 140A and the second support member portion 140B, as illustrated in FIG. 2, was prepared in an example of the present disclosure. In the example of the present disclosure, the length D of the second support member portion 140B is 300 μm, and the lengths d of the first and third bending areas BA1 and BA3 formed to be substantially flat are 170 μm.

In addition, a flexible display device according to a comparative example was prepared as a comparative sample. In the flexible display device according to the comparative example, only the support member 140 capable of supporting the first area 101 and the second area 103 is provided, differently from the example of the present disclosure. That is, in the flexible display device according to the comparative example, the length D of the second support member portion 140B is 0 μm. In order to evaluate bending reliability of the flexible display device 100 according to the example of the present disclosure and the flexible display device according to the comparative example, screen abnormality occurring during display driving in the flexible display devices according to the example and the comparative example were tested. Test results are shown in TABLE 1.

TABLE 1

|  | Number of Samples (ea) | Driving System Failure Rate | | |
| --- | --- | --- | --- | --- |
|  |  | Total | Bending Crack | Bending Abnormality |
| Comp. Example | 40 | 47.50% | 47.50% | 0.00% |
| Example | 60 | 0.00% | 0.00% | 0.00% |

Figure 3:
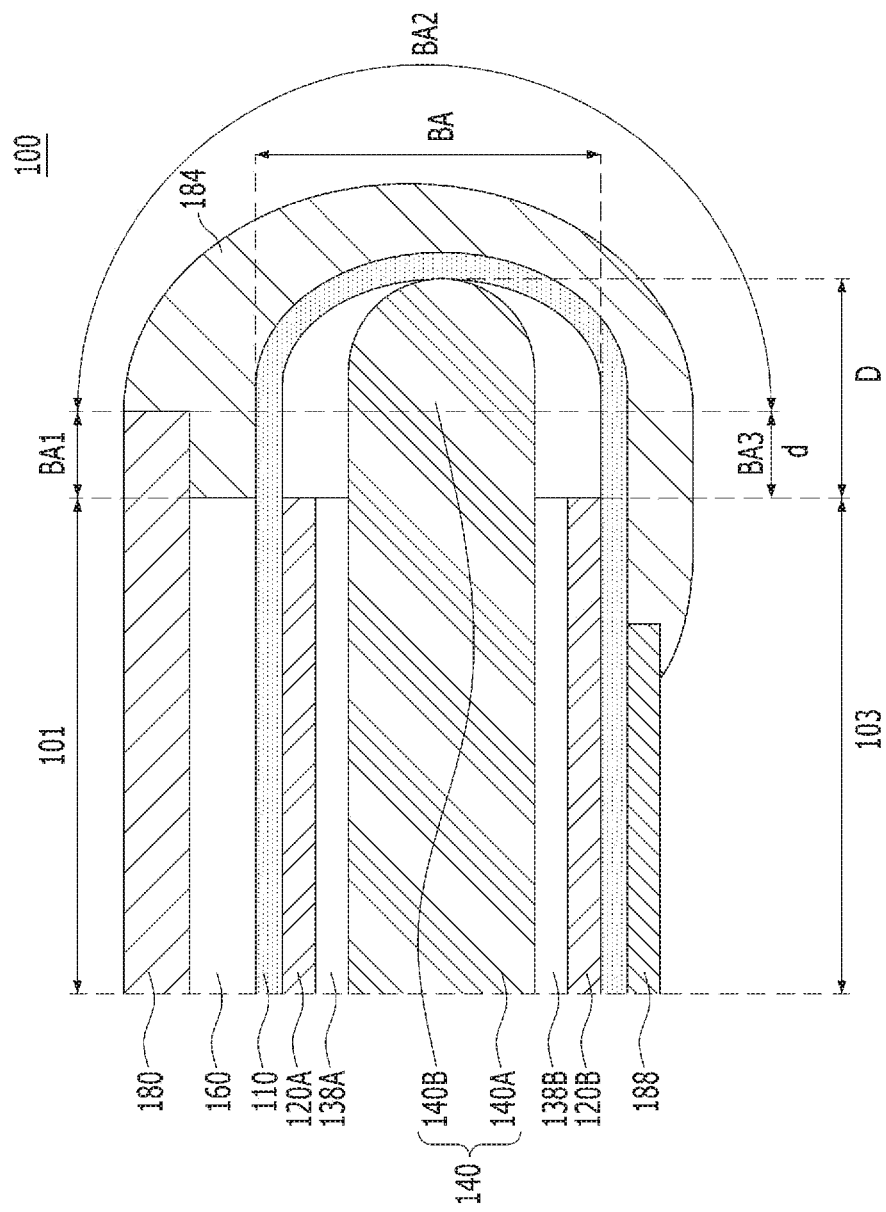
FIG. 3 is a sectional view illustrating a bending structure of the flexible display device when in a bent position according to an alternative embodiment of the present disclosure.

Referring to Table 1, it can be seen that the flexible display device according to the comparative example exhibits a high driving system failure rate caused by cracks in the bending area BA because the support member 140 does not support the bending area BA. On the other hand, it can be seen that the flexible display device 100 according to the example exhibits a driving system failure rate of 0% caused by cracks in the bending area BA. Thus, it can be seen that the flexible display device 100 according to the embodiment of the present disclosure has high reliability against screen abnormality caused by failure occurring due to bending, folding or the like. FIG. 3 is a sectional view illustrating a bending structure of the flexible display device 100 according to another embodiment of the present disclosure. In the bending structure of FIG. 3, the structure of the support member 140 in FIG. 2 is modified. In the description to follow, description will be given only in conjunction with the support member 140, and no overlapping description will be given of the remaining configurations except for the support member 140 and parts associated therewith.

Referring to FIG. 3, in this embodiment of the present disclosure, the support member 140 may include a first support member portion 140A for supporting lower surface portions of the flexible substrate 110 in the first area 101 and the second area 103, and a second support member portion 140B for supporting a lower surface portion of the flexible substrate 110 in the bending area BA. In order to guide bending of the bending area BA, the second support member portion 140B may include one end having a curved shape. For example, an end of the second support member portion 140B, which contacts the lower surface portion of the flexible substrate 110 corresponding to the bending area BA, may have a curved shape in order to maintain the radius of curvature of the bending area BA. The bending area BA may include a first bending area portion BA1, a second bending area portion BA2 and a third bending area portion BA3.

Figure 4B:
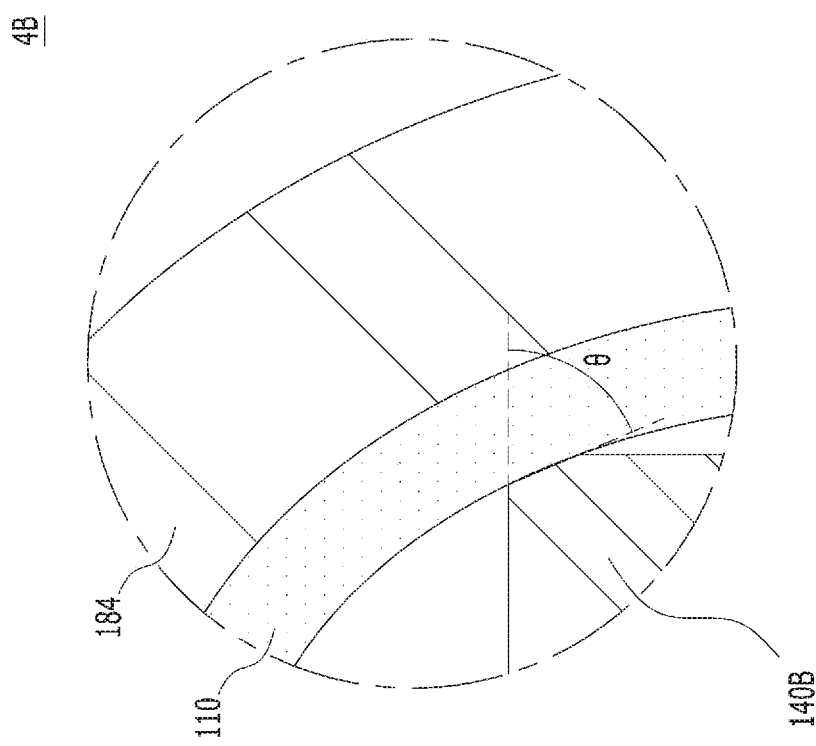
FIG. 4B is an enlarged view corresponding to a portion 4B of FIG. 4A.

FIG. 4A is a sectional view illustrating a bending structure of the flexible display device 100 according to an alternative embodiment of the present disclosure. FIG. 4B is an enlarged view corresponding to highlight 4B of FIG. 4A. In the bending structure of FIGS. 4A and 4B, the structure of the support member 140 in FIG. 2 is modified. In the description that follows, description will be given only in conjunction with modified parts, and no overlapping description will be given of the remaining configurations except for the modified parts.

Referring to FIGS. 4A and 4B, in this embodiment of the present disclosure, the support member 140 may include a first support member portion 140A for supporting portions of the flexible substrate 110 in the first area 101 and the second area 103, and a second support member portion 140B for supporting a portion of the flexible substrate 110 in the bending area BA. In addition, the second support member portion 140B may include an inclined portion having a predetermined angle θ corresponding to bending of the bending area BA. For example, an end of the second support member portion 140B, which contacts the lower surface portion of the flexible substrate 110 corresponding to the bending area BA, may have an inclined portion. The angle of the inclined portion formed at the second support member portion 140B may be an acute angle of less than 90°, but more than 0°. The angle of the inclined portion formed at the second support member portion 140B may be varied in accordance with the curvature of the bending area BA in the display device 100. As the inclined portion according to the curvature of the bending area BA is formed at the second support member portion 140B, the support member 140 may have a structure capable of smoothly guiding bending of the flexible substrate 110. The bending area BA may include a first bending area portion BA1, a second bending area portion BA2 and a third bending area portion BA3.

In accordance with the above-described embodiment of the present disclosure, the inclined portion of the support member 140 may be in linear contact or surface contact with the portion of the flexible substrate 110 in the bending area BA and, as such, may smoothly guide bending of the flexible substrate 110 while reducing stress concentration caused by bending or folding operation. For example, the inclined portion of the second support member portion 140B may be in linear contact or surface contact with the portion of the flexible substrate 110 corresponding to the bending area BA. In FIG. 4B illustrating the cross-sectional structure of the display device 100 in an enlarged state, the inclined portion of the second support member portion 140B is shown as being in point contact with the portion of the flexible substrate 110 corresponding to the bending area BA. In practice, however, the inclined portion of the second support member portion 140B in the display device 100 is in linear contact with the portion of the flexible substrate 110 corresponding to the bending area BA. Accordingly, although the cross-sectional structure of the display device 100 shows that the inclined portion of the support member 140 is in point contact with the portion of the flexible substrate 110 corresponding to the bending area BA, the inclined portion of the support member 140 in the display device 100 is substantially in linear contact with the portion of the flexible substrate 110 corresponding to the bending area BA.

Furthermore, although the cross-sectional structure of the display device 100 shows that the inclined portion of the support member 140 is in linear contact with the portion of the flexible substrate 110 corresponding to the bending area BA, the inclined portion of the support member 140 in the display device 100 is substantially in surface contact with the portion of the flexible substrate 110 corresponding to the bending area BA.

In addition, as illustrated in FIG. 4A, the second support member portion 140B may have at least two inclined portions. For example, the second support member portion 140B may include an inclined portion disposed in an area where the upper surface of the second support member portion 140B meets one side surface of the second support member portion 140B contacting the portion of the flexible substrate 110 corresponding to the bending area BA, and an inclined portion disposed in an area where the lower surface of the second support member portion 140B meets the side surface of the second support member portion 140B contacting the portion of the flexible substrate 110 corresponding to the bending area BA.

Figure 5A:
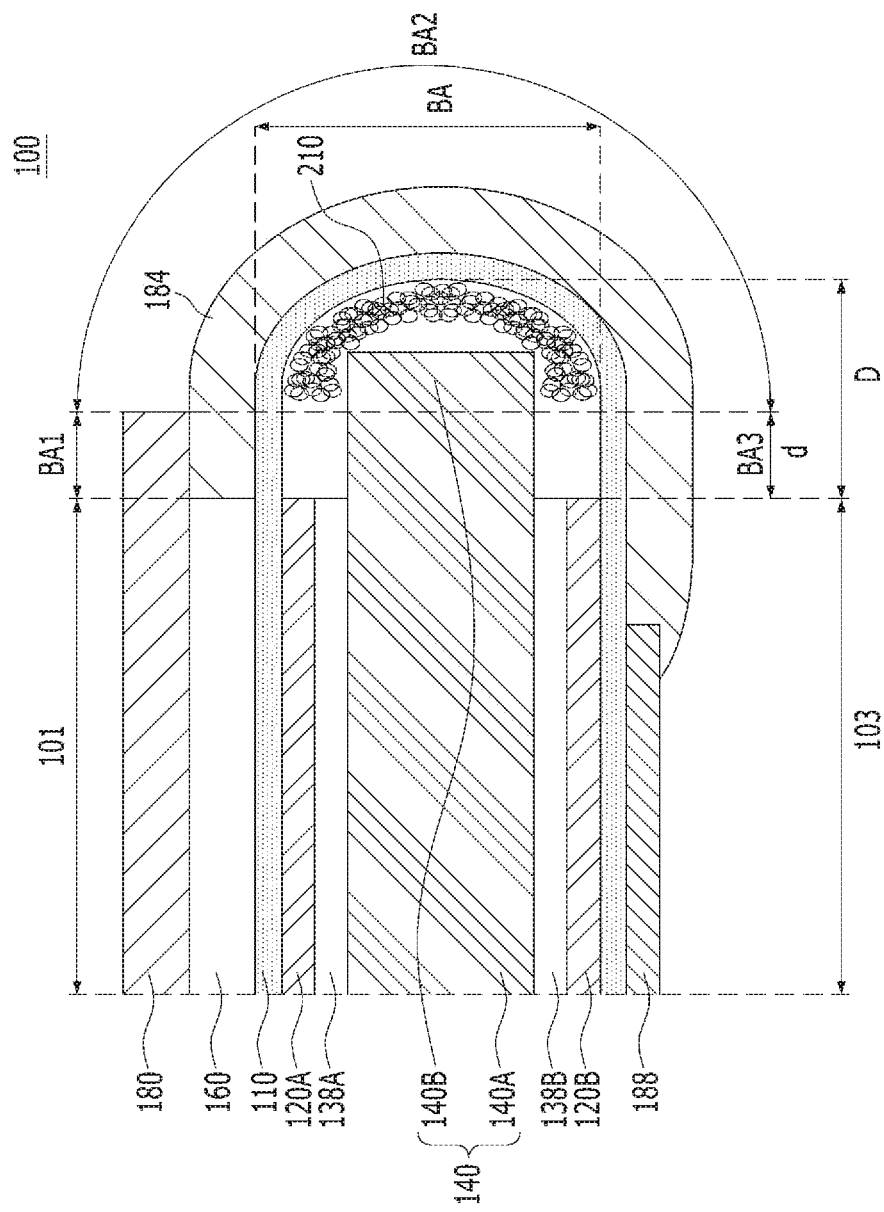

FIGS. 5A and 5B are sectional views of a structure of the display device 100 according to another embodiment of the present disclosure. In a description given in conjunction with FIGS. 5A and 5B, the description given in conjunction with FIG. 2 will be incorporated, and description of overlapping elements will be omitted or briefly given.

Referring to FIGS. 5A and 5B, the display device 100 may include a foaming agent 210 for supporting the portion of the flexible substrate 110 in the bending area BA. For example, the foaming agent 210 may include thermally-expandable foaming capsules. The foaming agent 210 may expand as the foaming capsules expand in accordance with a thermal treatment process, thereby forming independent air bubbles. The bending area BA may include a first bending area portion BA1, a second bending area portion BA2, and a third bending area portion BA3.

As illustrated in FIG. 5B, the foaming agent 210 may be disposed at the portion of the flexible substrate 110 in the bending area BA. Through a thermal treatment process, the foaming agent 210 disposed in the portion of the flexible substrate 110 in the bending area BA expands and, as such, may contact one end of the support member 140. For example, the foaming agent 210 may be disposed at a lower surface portion of the flexible substrate corresponding to the bending area BA. The foaming agent 210 may expand through the thermal treatment process, to enclose one end of the support member 140. As illustrated in FIG. 5A, the foaming agent 210 expanded through the thermal treatment process may stably maintain the radius of curvature of the bending area BA. The foaming agent 210 may function to stably guide and support bending of the flexible substrate 110.

The thermally-expandable foaming capsules included in the foaming agent may contain liquid phase hydrocarbon. The liquid phase hydrocarbon may include a low molecular weight hydrocarbon such as ethane, ethylene, propane, propene, methylbutane, n-butane, isobutane, butane, isobutane, n-pentane, isopentane, neopentane, n-hexane, heptane, isooctane, or petroleum ether, a chlorofluorocarbon such as $CCl_3F$, $CCl_2F_2$, $CClF_3$, or $CClF_2—CClF_2$, and may include a volatile hydrocarbon, for example, tetraalkylsilane such as tetramethylsilane, trimethylethyl silane, trimethylisopropyl silane, or trimethyl-n-propyl silane. However, in other alternative embodiments, the foaming agent may be another material that expands after being exposed a thermal treatment process.

Figure 6A:
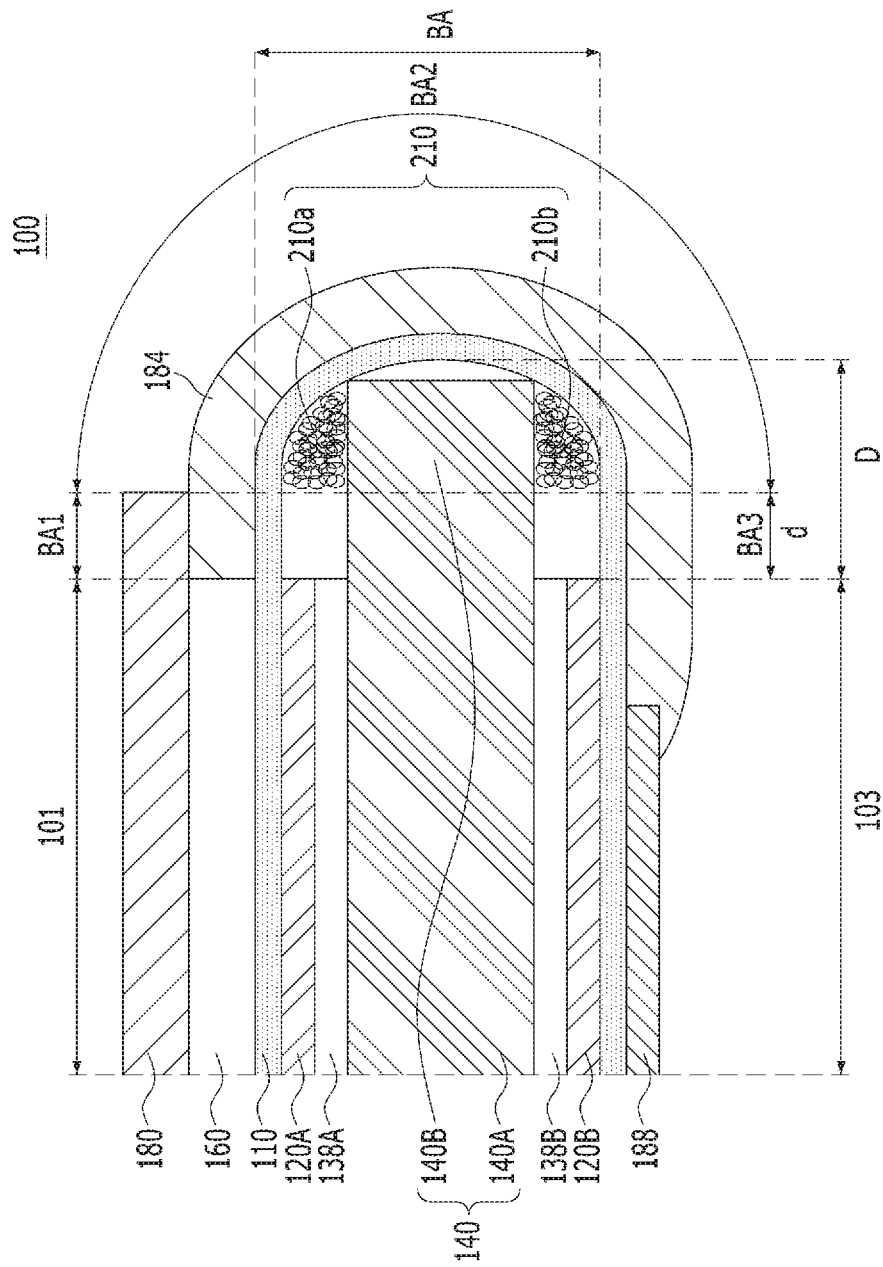
FIGS. 6A and 6B are sectional views of a structure of the flexible display device when in a bent position according to another alternative embodiment of the present disclosure.
Figure 6B:
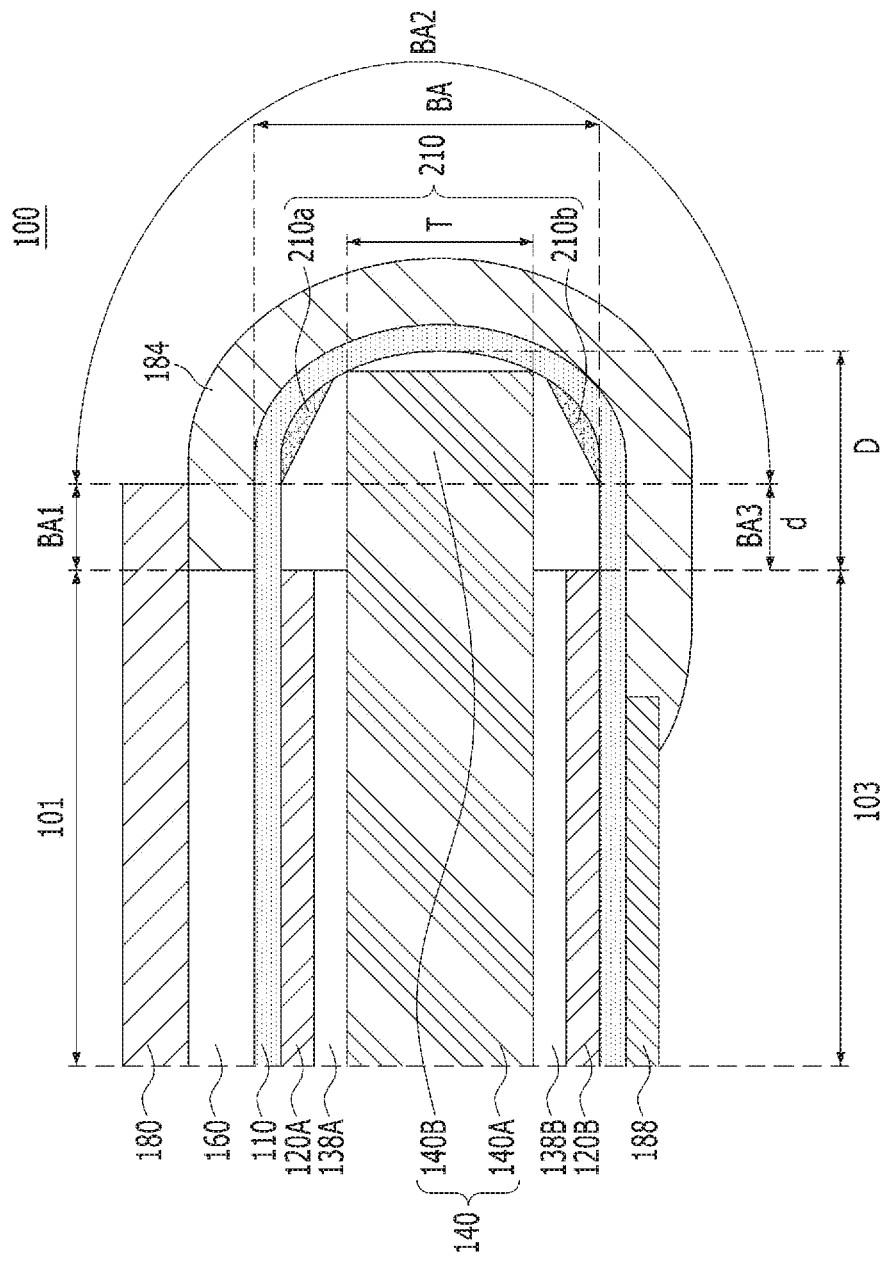

FIGS. 6A and 6B are sectional views of a structure of the display device according to another embodiment of the present disclosure. In a description given in conjunction with FIGS. 6A and 6B, the description given in conjunction with FIGS. 5A and 5B will be incorporated, and description of overlapping elements will be omitted or briefly given.

Referring to FIG. 6A, the support member 140 may be formed such that one end of the support member 140 extends to contact a portion of the flexible substrate 110 in the bending area BA. For example, the support member 140 may be formed such that one end of the support member 140 extends to contact a lower surface portion of the flexible substrate 110 corresponding to the bending area BA. The bending area BA may include a first bending area portion BA1, a second bending area portion BA2, and a third bending area portion BA3. In addition, the support member 140 may include a first support member portion 140A for supporting portions of the flexible substrate in the first area 101 and the second area 103, and a second support member portion 140B for supporting a portion of the flexible substrate 110 in the bending area BA. The first and second support member portions 140A, 140B of the support member 140 may be connected to each other and, as such, form an integrated structure. However, in other alternative embodiments, the first and second support member portions 140A, 140B may be portions of an already integrated support member, may be individual support members coupled together, may be individual support members altogether, or may be any other combination of support members or support member portions as desired to help support a bendable portion of a flexible display device when the bendable portion is in a bent position.

A foaming agent 210 may be disposed in an area between the second support member portion 140B of the support member 140 and the portion of the flexible substrate 110 in the bending area BA. The foaming agent 210 may include a first foaming agent 210a disposed between an upper surface of the second support member portion 140B and the portion of the flexible substrate 110 in the bending area BA, and a second foaming agent 210b disposed between a lower surface of the second support member portion 140B and the portion of the flexible substrate 110 in the bending area BA. For example, the first foaming agent 210a and the second foaming agent 210b may be disposed at a lower surface portion of the flexible substrate 110 corresponding to the bending area BA. In connection with this, the first foaming agent 210a may be disposed between the lower surface portion of the flexible substrate 110 corresponding to the bending area BA and the upper surface of the second support member portion 140B. In addition, the second foaming agent 210b may be disposed between the lower surface portion of the flexible substrate 110 corresponding to the bending area BA and the lower surface of the second support member portion 140B.

The first foaming agent 210a and the second foaming agent 210b may be disposed to be spaced apart from each other by the second support member portion 140B of the support member 140. The distance between the first foaming agent 210a and the second foaming agent 210b may be equal to or greater than the thickness of the support member 140. For example, the first foaming agent 210a and the second foaming agent 210b may be disposed to be spaced apart from each other by a distance equal to or greater than the thickness T of the second support member portion 140B of the support member 140.

As illustrated in FIG. 6B, the foaming agent 210, which includes the first foaming agent 210a and the second foaming agent 210b, may be disposed at the portion of the flexible substrate 110 in the bending area BA. The first foaming agent 210a and the second foaming agent 210b may be disposed at the portion of the flexible substrate 110 in the bending area BA while being spaced apart from each other. For example, the first foaming agent 210a and the second foaming agent 210b may be located in the bending area BA while being spaced apart from each other by a distance equal to or greater than the thickness T of the support member 140. In connection with this, the first foaming agent 210a may be disposed between the upper surface of the support member 140 and the portion of the flexible substrate 110 in the bending area BA. In addition, the second foaming agent 210b may be disposed between the lower surface of the support member 140 and the portion of the flexible substrate 110 in the bending area BA.

Through a thermal treatment process, the first foaming agent 210a and the second foaming agent 210b, which are disposed at the portion of the flexible substrate 110 in the bending area BA while being spaced apart from each other, may expand and, as such, may contact the upper and lower surfaces of the second support member portion 140B of the support member 140, respectively. For example, the first foaming agent 210a, which is disposed between the upper surface of the second support member portion 140B and a lower surface portion of the flexible substrate 110 in the bending area BA, may expand through a thermal treatment process and, as such, may contact the upper surface of the second support member portion 140B. On the other hand, the second foaming agent 210b, which is disposed between the lower surface of the second support member portion 140B and the lower surface portion of the flexible substrate 110 in the bending area BA, may expand through a thermal treatment process and, as such, may contact the lower surface of the second support member portion 140B. As illustrated in FIG. 6A, the foaming agent 210 expanded through the thermal treatment process may stably guide and support bending of the flexible substrate 110.

As apparent from the above description, in accordance with the display device of the present disclosure, it may be possible to obtain effects of enhancing durability against external impact applied to the display device and bending reliability by disposing the support member such that the support member can guide the bending area of the flexible substrate.

In accordance with the display device of the present disclosure, it may be possible to maintain the radius of curvature of the bending area by disposing the foaming agent between the support member and the bending area of the flexible substrate. In addition, the foaming agent may function to stably guide and support bending of a portion of the flexible substrate corresponding to the bending area.

Display devices according to the present disclosure may be explained as follows.

A display device according to an embodiment of the present disclosure includes a flexible substrate including a first area including a display area to display an image, a second area facing the first area while being spaced apart from the first area, and a bending area connecting the first area and the second area while being bent, a cover layer and a polarization layer, which are disposed on a portion of an upper surface of the flexible substrate corresponding to the first area, a pad part disposed on a portion of the upper surface of the flexible substrate corresponding to the second area, a first support plate disposed on a portion of a lower surface of the flexible substrate corresponding to the first area, and a second support plate disposed on a portion of the lower surface of the flexible substrate corresponding to the second area, and a support member disposed between the first support plate and the second support plate. One end of the support member may extend to contact a portion of the lower surface of the flexible substrate corresponding to the bending area, to support the radius of curvature of the bending area.

The support member may include a first support member for supporting the first support plate and the second support plate, and a second support member extending from the first support member, to contact the lower surface portion of the flexible substrate corresponding to the bending area.

The display device may further include a protective cover layer disposed on a portion of the upper surface of the flexible substrate corresponding to the bending area.

One end of the second support member contacting the lower surface portion of the flexible substrate corresponding to the bending area may have a curved shape.

The second support member may be provided with an inclined portion at one end thereof contacting the lower surface portion of the flexible substrate corresponding to the bending area.

The inclined portion of the second support member may be in linear contact or surface contact with the lower surface portion of the flexible substrate corresponding to the bending area The display device may further include a first foaming agent disposed between the lower surface portion of the flexible substrate corresponding to the bending area and an upper surface of the second support member, and a second foaming agent disposed between the lower surface portion of the flexible substrate corresponding to the bending area and a lower surface of the second support member.

The first foaming agent and the second foaming agent may be spaced apart from each other by the second support member.

The distance between the first foaming agent and the second foaming agent may be equal to or greater than a thickness of the second support member.

The first foaming agent and the second foaming agent may include thermally-expandable foaming capsules.

The first foaming agent may contact the lower surface portion of the flexible substrate corresponding to the bending area and the upper surface of the second support member. The second foaming agent may contact the lower surface portion of the flexible substrate corresponding to the bending area and the lower surface of the second support member.

In accordance with another embodiment of the present disclosure, a display device includes a flexible substrate comprising a first area including a display area to display an image, a second area facing the first area while being spaced apart from the first area, and a bending area connecting the first area and the second area while being bent, a cover layer and a polarization layer, which are disposed on a portion of an upper surface of the flexible substrate corresponding to the first area, a pad part disposed on a portion of the upper surface of the flexible substrate corresponding to the second area, a first support plate disposed on a portion of a lower surface of the flexible substrate corresponding to the first area, and a second support plate disposed on a portion of the lower surface of the flexible substrate corresponding to the second area, a support member disposed between the first support plate and the second support plate, and a foaming agent disposed on a portion of the lower surface portion of the flexible substrate corresponding to the bending area.

The foaming agent may be disposed to contact one end of the support member.

The foaming agent may enclose the end of the support member.

The end of the support member may extend to contact the lower surface portion of the flexible substrate corresponding to the bending area.

The foaming agent may include a first foaming agent and a second foaming agent. The first foaming agent and the second foaming agent may be disposed on the lower surface of the flexible substrate while being spaced apart from each other by a distance equal to or greater than a thickness of the support member.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims. Thus, it is intended that the present disclosure cover the modifications and variations of this disclosure provided they come within the scope of the appended claims and their equivalents.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
 a flexible substrate including a first area having a display area to display an image, a second area facing the first area while being spaced apart from the first area, and a bending area extending from the first area and the second area and being in a bent position;
 a cover layer and a polarization layer on a portion of a first surface of the flexible substrate corresponding to the first area;
 a pad part disposed on a portion of the first surface of the flexible substrate corresponding to the second area;
 a first support plate on a first portion of a second surface of the flexible substrate corresponding to the first area, and a second support plate on a second portion of the second surface of the flexible substrate corresponding to the second area; and a support member located between the first support plate and the second support plate, wherein the support member comprises a first portion for supporting the first support plate and the second support plate, and a second portion extending from the first portion and extending to contact the second surface of the flexible substrate corresponding to the bending area, and wherein the second portion of the support member includes a first end having an inclined portion contacting the second surface of the flexible substrate corresponding to the bending area, and wherein the inclined portion of the first end of the second portion of the support member includes a first inclined portion and a second inclined portion both in contact with the second surface of the flexible substrate, and a flat side surface connecting the first inclined portion and the second inclined portion and facing the second surface of the bending area of the flexible substrate.

2. The display device of claim 1, further comprising:
a protective cover layer on a portion of the first surface of the flexible substrate corresponding to the bending area.

3. The display device of claim 1, wherein the inclined portion of the second portion of the support member is in linear contact or surface contact with the second surface of the flexible substrate corresponding to the bending area.

4. The display device of claim 1, further comprising:
a first thermally-expandable agent located between the second surface of the flexible substrate corresponding to the bending area and a first surface of the second portion of the support member; and
a second thermally-expandable agent located between the second surface of the flexible substrate corresponding to the bending area and a second surface of the second portion of the support member.

5. The display device of claim 4, wherein the first thermally-expandable agent and the second thermally-expandable agent are spaced apart from each other by the second portion of the support member.

6. The display device of claim 5, wherein a distance between the first thermally-expandable agent and the second thermally-expandable agent is at least a thickness of the second portion of the support member.

7. The display device of claim 4, wherein the first thermally-expandable agent and the second thermally-expandable agent comprise thermally-expandable foaming capsules.

8. The display device of claim 4, wherein:
the first thermally-expandable agent contacts the second surface of the flexible substrate corresponding to the bending area and the first surface of the second portion of the support member; and
the second thermally-expandable agent contacts the second surface of the flexible substrate corresponding to the bending area and the second surface of the second portion of the support member.

9. A display device, comprising:
a flexible substrate comprising a first area including a display area adapted to display an image, a second area being spaced apart from the first area, and a bending area connecting the first area and the second area and being in a bent position;
a cover layer and a polarization layer on a portion of a first surface of the flexible substrate corresponding to the first area;
a pad part on a portion of the first surface of the flexible substrate corresponding to the second area;
a first support plate on a portion of a second surface of the flexible substrate corresponding to the first area, and a second support plate on a portion of the second surface of the flexible substrate corresponding to the second area;
a support member located between the first support plate and the second support plate; and
a thermally-expandable agent on the second surface of the flexible substrate corresponding to the bending area,
wherein the thermally-expandable agent is located between a first end portion of the support member and the second surface of the bending area of the flexible substrate, the thermally-expandable agent not overlapping the first support plate and the second support plate.

10. The display device of claim 9, wherein the thermally-expandable agent contacts an end of the support member.

11. The display device of claim 10, wherein the thermally-expandable agent encloses the end of the support member.

12. The display device of claim 10, wherein the end of the support member contacts the lower surface of the flexible substrate corresponding to the bending area.

13. The display device of claim 12, wherein:
the thermally-expandable agent includes a first thermally-expandable agent and a second thermally-expandable agent; and
the first thermally-expandable agent and the second thermally-expandable agent are on the second surface of the flexible substrate while being spaced apart by at least a thickness of the support member.

14. The display device of claim 9, wherein the support member has a first end that includes corners.

15. A display device, comprising:
a flexible substrate including a first surface, a second surface, a first portion, a second portion, and a bendable portion extending from the first portion to the second portion;
a polarization layer on the first surface of the first portion of the flexible substrate;
a cover layer on the polarization layer;
a protective layer on the first surface of the bending portion of the flexible substrate;
a pad part on the first surface of the second portion of the flexible substrate;
a first support plate on the second surface of the first portion of the flexible substrate;
a second support plate on the second surface of the second portion of the flexible substrate;
a support member located between the first support plate and the second support plate; and
a thermally-expandable agent located between a first end portion of the support member and the second surface of the bending area of the flexible substrate, the thermally-expandable agent not overlapping the first support plate and the second support plate.

16. The display device of claim 15, wherein the support member has a first end that is a curved surface that supports the bendable portion of the flexible substrate when the bendable portion is in a bent position.

17. The display device of claim 15, wherein the thermally-expandable agent on the second surface of the flexible substrate is aligned with the bending portion.

18. The display device of claim 15, further comprises:
a plurality of conductive lines extending from the first portion along the bending portion to the pad part on the second portion of the flexible substrate; and a plurality of driving circuits on the first surface and the first portion of the flexible substrate.

19. The display device of claim 18, wherein the plurality of conductive lines shift a predetermined distance at a location adjacent to a first end of the first portion of the flexible substrate.

20. The display device of claim 15, wherein the flexible substrate includes a display area, a bending area, and a plurality of non-bending areas.

* * * * *